(12) United States Patent
Villa et al.

(10) Patent No.: US 6,455,391 B1
(45) Date of Patent: Sep. 24, 2002

(54) METHOD OF FORMING STRUCTURES WITH BURIED REGIONS IN A SEMICONDUCTOR DEVICE

(75) Inventors: Flavio Villa; Gabriele Barlocchi, both of Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 15 days.

(21) Appl. No.: 09/613,109

(22) Filed: Jul. 10, 2000

(30) Foreign Application Priority Data

Jul. 9, 1999 (EP) .............................. 99830442

(51) Int. Cl.[7] .............................. H01L 21/76
(52) U.S. Cl. ...................... 438/370; 438/407
(58) Field of Search ................... 438/370, 407, 438/410, 692, 207, 234, 295, 355, 405

(56) References Cited

U.S. PATENT DOCUMENTS

| 4,502,913 A | * | 3/1985 | Lechaton et al. |
| 4,604,162 A | | 8/1986 | Sobczak ..................... 156/657 |
| 4,814,287 A | * | 3/1989 | Takemono et al. |
| 4,891,092 A | | 1/1990 | Jastrzebski .................. 156/610 |
| 5,907,782 A | * | 5/1999 | Kim et al. ................... 438/407 |

FOREIGN PATENT DOCUMENTS

| EP | 0 929 095 | * | 7/1999 |
| EP | 99830442.2 | | 7/1999 |
| JP | 56 12749 | | 2/1981 |

* cited by examiner

Primary Examiner—David Nelms
Assistant Examiner—Dung Anh Le
(74) Attorney, Agent, or Firm—Lisa K. Jorgenson; E. Russell Tarleton; Seed IP Law Group PLLC (57) ABSTRACT

A monocrystalline silicon substrate is subjected to the following operations: implantation of doping impurities in a high concentration to form a planar region of a first type; selective anisotropic etching in order to hollow out trenches to a depth greater than the depth of the planar region; oxidation of the silicon inside the trenches, starting a certain distance from the surface of the substrate, until a silicon dioxide plaque is formed, surmounted by residues of strongly-doped silicon; epitaxial growth between and on top of the silicon residues to close the trenches and to bring about a redistribution of the doping impurities into the silicon grown to produce a buried region with low resistivity in an epitaxial layer of high resistivity.

25 Claims, 5 Drawing Sheets

METHOD OF FORMING STRUCTURES WITH BURIED REGIONS IN A SEMICONDUCTOR DEVICE

TECHNICAL FIELD

The present invention relates to the manufacture of semiconductor devices and, more particularly, to a method of forming a structure with buried regions in a semiconductor device.

BACKGROUND OF THE INVENTION

In the design of integrated circuits, there is often a need to produce components having different electrical characteristics, for example, power transistors, diodes with high reverse-breakdown voltages, signal transistors for signal-processing units and control units. There is a particular need for very good insulation from the substrate, particularly for components of some types, to prevent parasitic currents and interference with the operation of the integrated circuit. For these components, it is often very helpful to use techniques that enable insulating layers of dielectric material to be formed. One of these techniques is based on the use of SOI (silicon on insulator) wafers, that is, composite wafers constituted by two layers of silicon, one thicker layer which acts as a support and one thinner layer in which the components of the integrated circuit are formed, the layers being separated by a layer of silicon dioxide. For other components, for example, power transistors with vertical conduction, it is necessary to use a wafer constituted by a substrate of monocrystalline silicon covered by a thin silicon layer produced by epitaxial growth.

A method of manufacturing SOI wafers is the subject of European patent application 98830007.5 filed on Jan. 13, 1998, in the name of SGS-Thomson Microelectronics S.r.l, and which is incorporated in its entirety herein by reference. The main steps of this method are common to the method of the present invention and will therefore be described below in the course of the description of an embodiment of the invention. This known method was designed to be used mainly to produce an SOI structure that extends throughout the wafer but may also be used to produce an SOI structure on only a portion of the wafer. It is therefore suitable for the production of integrated circuits comprising both power components with vertical conduction and components with good insulation, that is, with practically zero leakage currents to the substrate.

Figure 1:
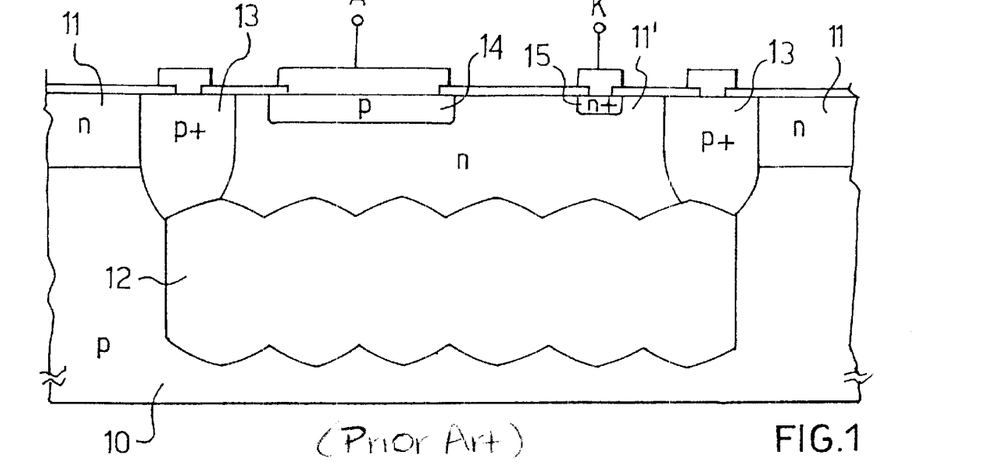
FIG. 1 shows, in section, a portion of a wafer comprising an insulated device formed by the method described in the patent application cited above.

A component with good insulation that can be produced by this method is shown in FIG. 1. In particular, FIG. 1 shows, in section, a portion of a wafer containing a diode.

The wafer comprises a substrate 10 of monocrystalline silicon with p-type conductivity and an epitaxial layer 11 formed on the substrate 10. A silicon dioxide plaque 12 separates a portion of the epitaxial layer 11 from the substrate. A diffused planar region 13 with p-type conductivity and with low resistivity (and hence indicated p+) extends from the front surface of the wafer as far as the oxide plaque 12 in the form of a ring or frame inside which an epitaxial region 11' is defined. Two planar regions, that is, a p-type region 14 and an n-type region 15 with low resistivity (and hence indicated n+) are formed in this epitaxial region and each has, on the surface, a contact electrode with the function of an anode terminal A and of a cathode terminal K of the diode, respectively. The diode is insulated from the substrate 10 very effectively but has a considerable resistance when it is biased for direct conduction because of the relatively high resistivity of the epitaxial region 11'.

A usual method of reducing this resistance is to form a buried n-type layer of low resistivity by implantation of a high dose of doping ions before the growth of the epitaxial layer. With the known method, however, the growth of the epitaxial layer on the portion of the wafer in which the oxide plaque has been formed takes place on a discontinuous surface partly of silicon and partly of oxide so that it is a critical operation per se (this processing step according to the known method will also be described below since it is common to the known method and the method according to the invention). Implantation at this point would not be advisable because it would lead to unacceptable contamination of the oxide of the plaque 12 or would require masking operations which would complicate the method considerably.

SUMMARY OF THE INVENTION

The embodiment of the present invention is directed to a method by which it is possible to form integrated circuits comprising components of different types including components that are completely insulated from the substrate and which have a low resistance during direct conduction.

A particular aspect of the embodiment of the present invention is a method that enables high-performance devices with dielectric insulation and buried regions to be formed.

These objects are achieved by a method for forming a semiconductor device on a monocrystalline silicon substrate that includes forming a planar region of a predetermined depth to have a first conductivity type in the monocrystalline silicon substrate; etching the planar region and the monocrystalline silicon substrate to form trenches through the planar region and into the monocrystalline silicon substrate; transforming regions in the monocrystalline silicon substrate below the planar region and between the trenches into silicon dioxide to form a silicon dioxide plaque; and forming a buried region of the first conductivity type over the silicon dioxide plaque by subjecting the monocrystalline silicon substrate to epitaxial growth to fill in the trenches and distribute doping impurities to achieve homogeneous resistivity throughout the buried region.

In accordance with another aspect of the present invention, a method for forming a structure with a buried region in a semiconductor device having the following steps is provided: Introducing doping impurities into a monocrystalline silicon substrate through a portion of a flat major surface of the substrate to a predetermined depth to form a planar region having a first type of conductivity; subjecting the substrate to selective anisotropic etching to form trenches in the substrate from the portion of the major surface to a depth greater than the predetermined depth; oxidizing the silicon within the trenches starting a predetermined distance from the major surface of the substrate until the portions of the substrate between the adjacent trenches are transformed into silicon dioxide and until the trenches are filled with silicon dioxide below a level defined by the predetermined distance in order to form a silicon dioxide plaque; and subjecting the substrate to a treatment of epitaxial growth from a vapor phase, the operative parameter selected in a manner to permit a growth of monocrystalline silicon inside the portions of the trenches that are still open until the trenches are closed and on top of the major surface of the substrate in a manner to permit a redistribution of the doping impurities into the monocrystalline silicon grown and to form a region with the first type of conductivity having substantially homogeneous resistivity buried in an epitaxial layer and extending on the silicon dioxide plaque.

BRIEF DESCRIPTION OF THE DRAWINGS

The invention will be understood further from the following detailed description of a non-limiting embodiment, given with reference to the appended drawings, in which.

DETAILED DESCRIPTION OF THE INVENTION

Figure 2:
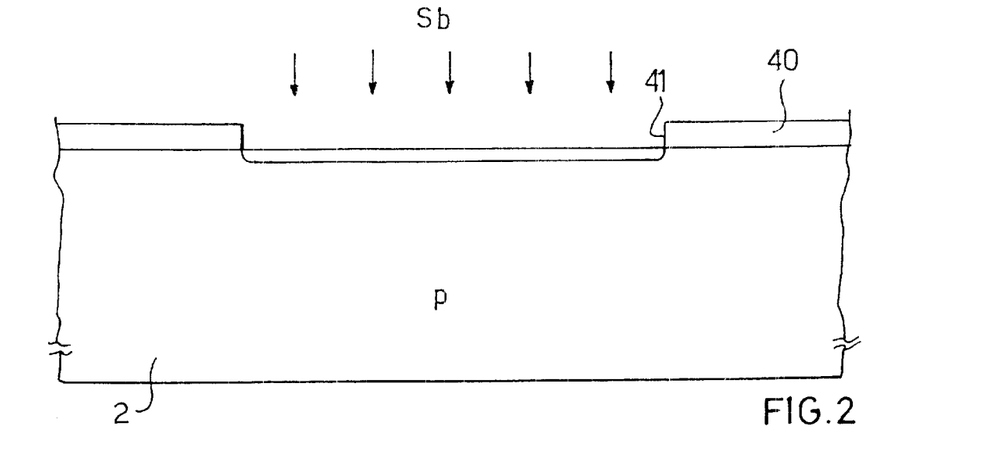
FIGS. 2 to 15 show, in section, a portion of a wafer at various stages of processing in accordance with the method of the invention.
Figure 3:
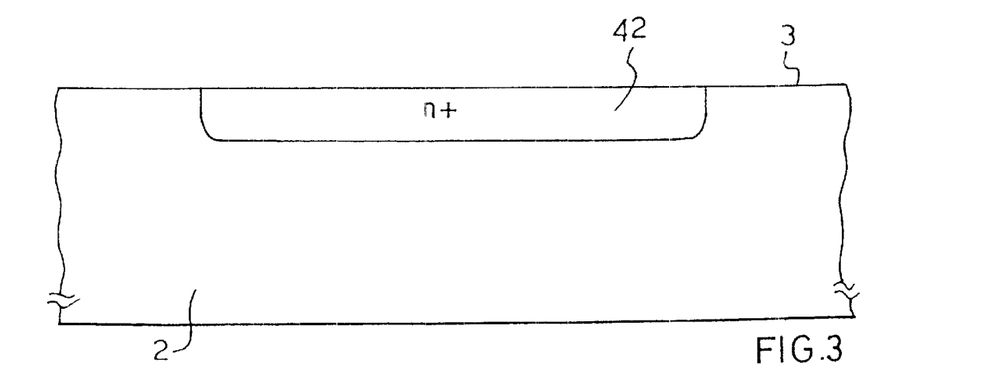

Referring initially to FIG. 2, the method according to the disclosed embodiment of the invention starts with the formation, on a major flat surface of a monocrystalline silicon substrate 2 with p-type conductivity and resistivity of 0.01–150 ohm.cm, of a mask 40 of material resistant to implantation, for example, resist, having an opening 41. Doping impurities are implanted in the substrate 2 with a high dose through this opening, for example, antimony (Sb) is implanted with a dose of $2.5 \cdot 10^{15}$ atoms/cm$^2$ and an energy of 80 Kev (FIG. 2). After the removal of the mask 40, with subsequent high-temperature treatment (for example 1250° C. for 4 hours), the impurities diffuse in the substrate 2 and form a region 42 with low resistivity (about $15$–$20 \cdot 10^{-3}$ ohm.cm) (FIG. 3) which extends to a depth of about 10 μm.

Figure 4:
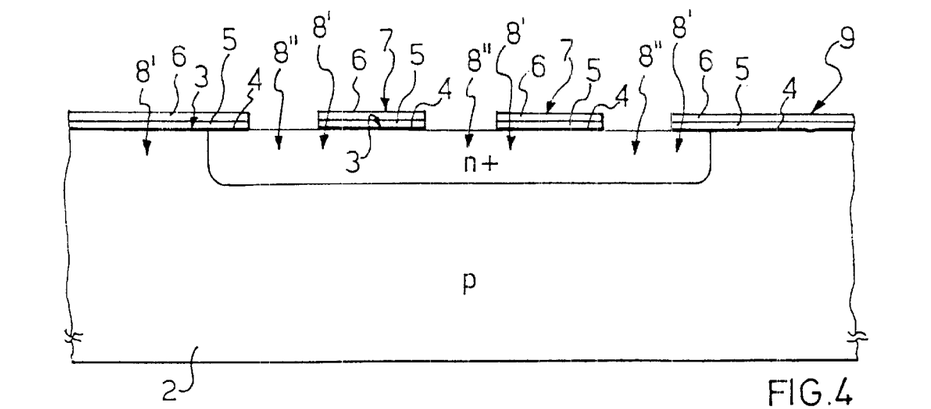

A first layer of silicon dioxide with a thickness, for example, of between 20 and 60 nm is formed by thermal oxidation on the front surface 3 of the substrate 2, at least on the region 42; a first layer of silicon nitride with a thickness of between 90 and 150 nm and a second layer of silicon dioxide, produced by decomposition of tetraethyl orthosilicate (TEOS) and having a thickness of between 100 and 600 nm, are then deposited thereon. A structure, for example with rectangular areas, is defined in plan with the use of a resist layer and a masking operation. Dry etching of the exposed portions of the oxide layer produced from TEOS, of the first nitride layer, and of the first oxide layer is then performed and the residual resist is then removed, producing the structure shown in section in FIG. 4. The portions of the first oxide layer, of the first nitride layer, and of the oxide layer produced from TEOS which remain after the dry etching are indicated 4, 5 and 6, respectively and together define protective plaques 7 covering portions 8' of the monocrystalline silicon substrate 2.

Figure 5:
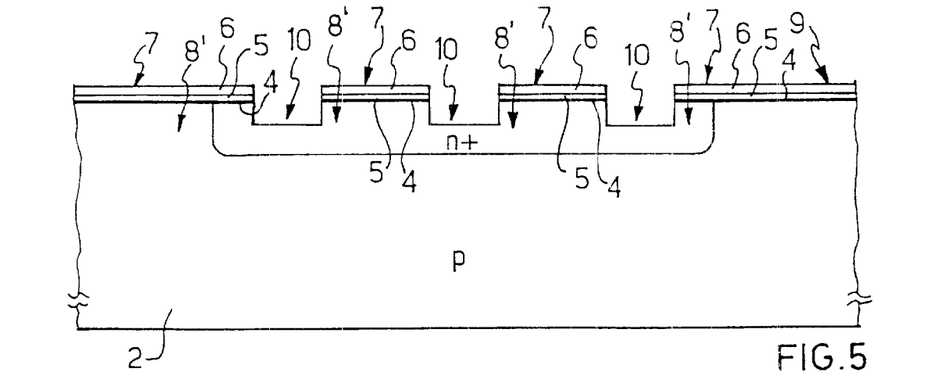

The protective plaques 7 form a mask, generally indicated 9, for subsequent selective anisotropic etching of the silicon substrate 2. The portions of the substrate 2 which are indicated 8" in FIG. 4, and which are not protected by the mask 9 are etched by this treatment so that initial trenches 10 are formed (FIG. 5).

Figure 6:
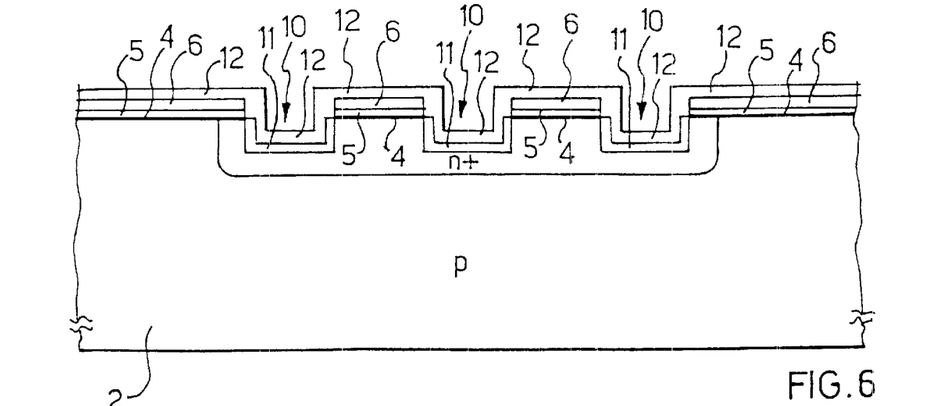

Then, as shown by FIG. 6, the structure is subjected to an oxidation step leading to the formation of a third silicon dioxide layer 11 which has a thickness, for example, of between 20 and 60 nm and which covers the walls and the base of the initial trenches 10. A second silicon nitride layer 12 with a thickness of between 90 and 150 nm is then deposited.

Figure 7:
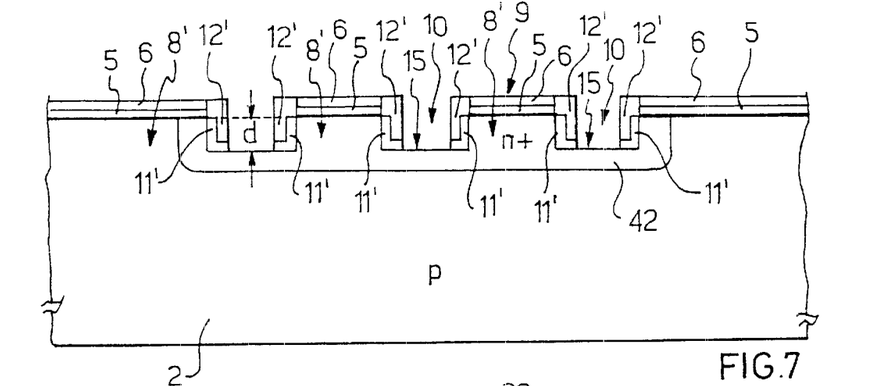

The method continues with dry anisotropic etching during which the horizontal portions of the second silicon nitride layer 12 are removed. During this etching, the first nitride layer 5 is protected by the silicon dioxide layer 6 produced from TEOS. The third silicon dioxide layer 11 which is disposed in the bases of the initial trenches 10 is removed in a wet process. The structure shown in FIG. 7, which shows the portions 8' still covered at the top by the mask 9 and at the sides (on the vertical walls of the initial trenches 10) by oxide and nitride portions 11' and 12', respectively, and the exposed bases 15 of the initial trenches 10, is thus produced.

Anisotropic etching of the silicon is then performed with the use, as a mask, of the mask 9 modified by the addition of the oxide and nitride portions 11' and 12', respectively. The exposed silicon in the bases 15 of the initial trenches 10 is etched for sufficient time to produce final trenches 16 which extend in depth beyond the boundary of the n+ region 42. It will be noted that the difference between the depth of the final trenches 16 and that of the initial trenches 10 determines the dimensions of the buried oxide layer, as will become clearer from the following. The depth of etching is therefore selected on the basis of the specification of the SOI wafer to be produced.

Figure 8:
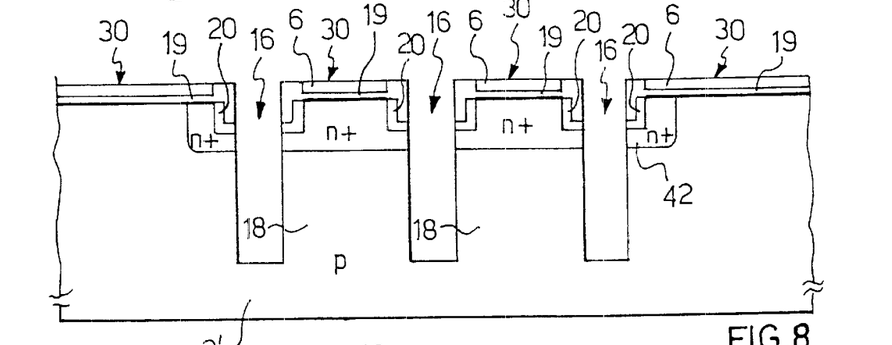

The monocrystalline silicon substrate thus treated is now formed by a base portion indicated 2' and by a plurality of "pillars" 18 of rectangular cross-section extending from the base portion 2' towards the surface of the wafer. That is, the structure shown in FIG. 8 is produced, in which the nitride portions 5 and 12' are no longer distinct from one another and are together indicated 19 and the oxide portions 4 and 11' are together indicated 20. The portions 19 and 20 with the overlying portions 6 of oxide produced from TEOS together constitute a mask 30.

Figure 9:
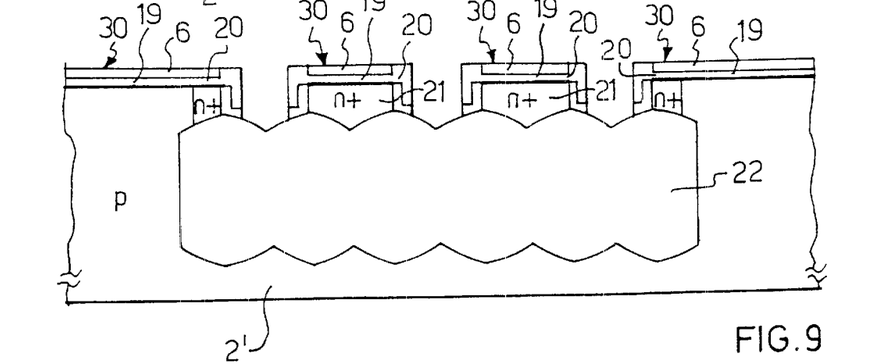

The silicon substrate is then subjected to selective oxidation, with the use of the mask 30 for protecting the silicon from oxidation as far as a predetermined distance d from the surface of the substrate. The process continues until the portions of the pillars 18 which are not protected by the mask 30 are completely transformed into silicon dioxide. In practice, a gradual growth of the oxide regions takes place at the expense of the silicon regions, starting from the side walls of the final trenches 16 towards the interiors of the pillars 18 and also partially into the base portion 2'. Since the volume of the silicon dioxide which is formed is greater than that of the starting silicon, the oxide regions being formed gradually take up the space in the final trenches 16 until these are completely closed and joined together. The oxidation step finishes automatically when the pillars 18 are completely oxidized (naturally apart from their tops, indicated 21, which are protected by the mask 30). An oxide region or plaque 22 which is buried to a large extent is thus formed, as shown in FIG. 9.

Figure 10:
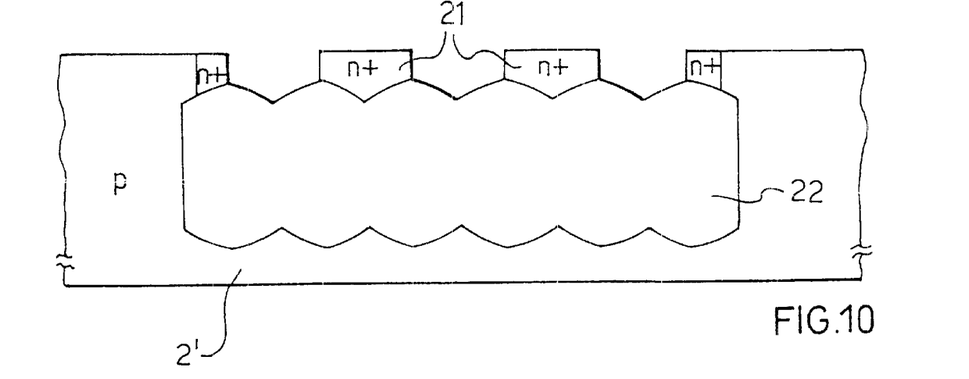

The oxide portions 6 produced from TEOS, the nitride portions 19 and the oxide portions 20 which constitute the mask 30 are then removed by selective etching so as to expose the tops 21 which are to form seeds for subsequent epitaxial growth, and the rest of the surface of the substrate. The resulting structure is shown in FIG. 10.

The epitaxial growth is performed from a vapor phase, the operative parameters being selected in a manner such as to prevent nucleation of polycrystalline silicon in the exposed zones of the buried oxide region 22 and in a manner such that the lateral/vertical growth ratio is high. A growth of the silicon in a lateral direction around the tops 21 is thus achieved first of all, until the portions of the trenches which are still open are filled, with the subsequent growth of an epitaxial layer in a direction perpendicular to the major surface of the substrate. During the epitaxial growth, which takes place at a temperature of between 900 and 1230° C. and has a duration of 15 minutes, the doping impurities (antimony in this example) which are present in what remains of the region 42 diffuse into the epitaxial layer being formed so as to form a homogeneous buried region. Naturally, the dose of the initial implantation (FIG. 2) is determined in a manner such that this buried region has the desired resistivity. The epitaxial growth preferably takes place in an atmosphere containing doping impurities, for example, phosphorus, so that the epitaxial layer has the same type of conductivity as the buried region and a greater resistivity (for example 1.1–1.6 ohm.cm).

Figure 11:
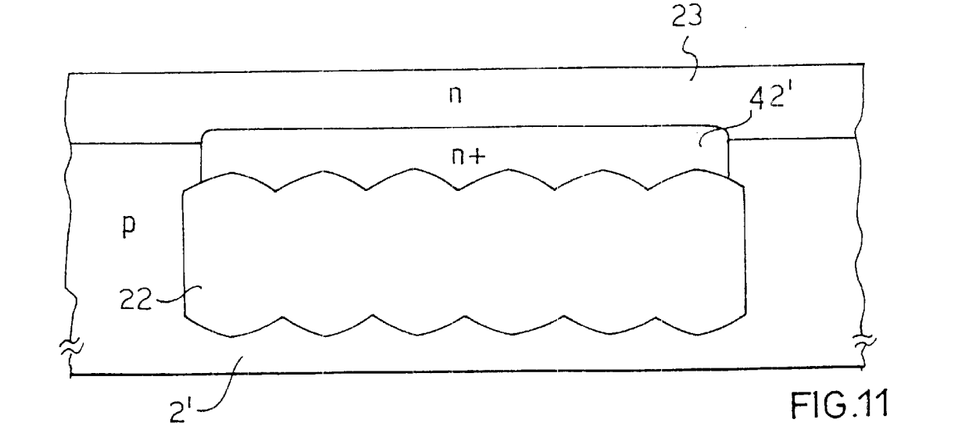

After an optional chemical-mechanical lapping step to flatten the surface of the epitaxial layer, the final structure shown in FIG. 11 is produced, in which the buried region is indicated 42' and the residual epitaxial layer is indicated 23.

All of the usual components necessary to form the integrated circuit can now be formed in the epitaxial layer 23. Moreover, by virtue of the method according to the invention, it is easy to produce components that are free of current leakages towards the substrate and which have very low resistance during direct conduction. As an example of such a component, the main steps for the production of a diode which, owing to its optimal characteristics of insulation and resistance during conduction, may form part, for example, of a high-performance diode bridge in an integrated circuit for controlling an electric motor, are described below.

In order to insulate the diode laterally, the usual junction insulation technique may be used, as in the example described with reference to FIG. 1, or a technique of insulation with dielectric, which is more advantageous in terms of electrical performance and area occupied, may be used. A technique of this latter type is described herein with reference to FIGS. 12 to 15.

Figure 12:
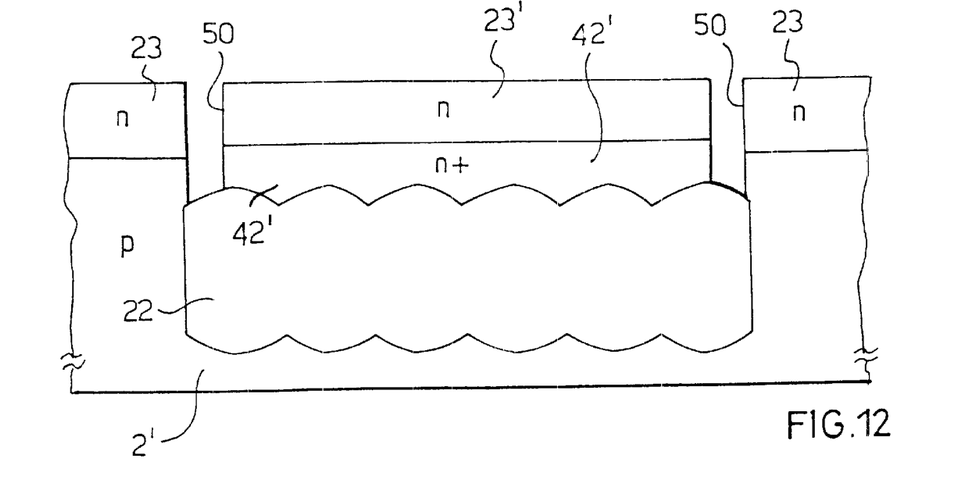

A channel 50 which extends from the surface of the epitaxial layer 23 to the oxide plaque 22 and is shaped as a ring or a frame so as to enclose within it a portion 23' of the epitaxial layer 23 with the underlying buried layer 42' is hollowed out by normal masking and anisotropic etching operations (FIG. 12).

Figure 13:
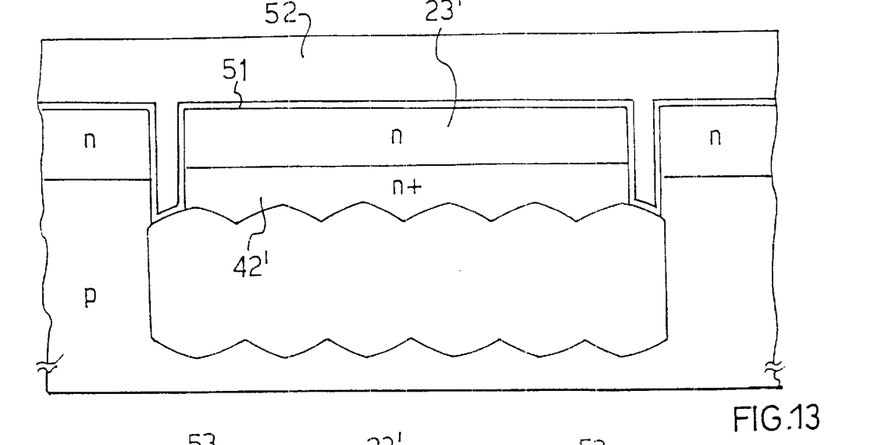

The surface of the epitaxial layer 23 and the internal walls of the channel are covered with a layer 51 of dielectric material, for example, silicon dioxide produced from TEOS. Polycrystalline silicon is then deposited so as to fill the channel 50 and to cover the front surface of the wafer with a layer 52 (FIG. 13).

Figure 14:
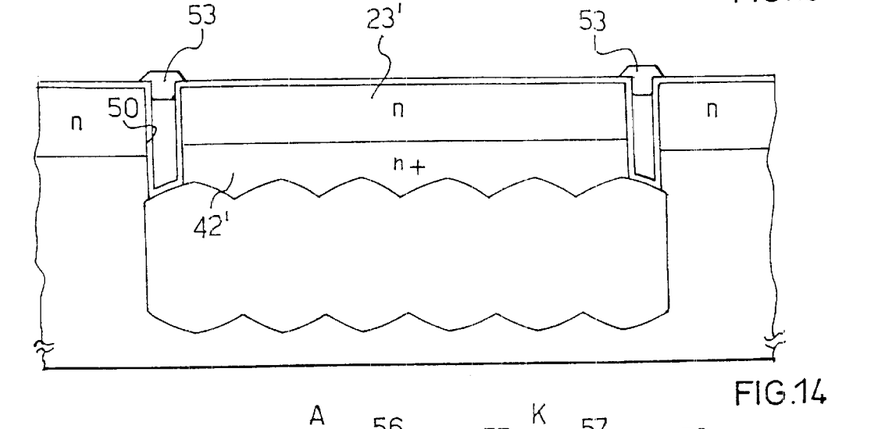

The polycrystalline silicon layer 52 is partially removed by dry etching and is then oxidized so as to form a silicon dioxide insert 53 in the mouth of the channel 50 until the channel is closed (FIG. 14).

Figure 15:
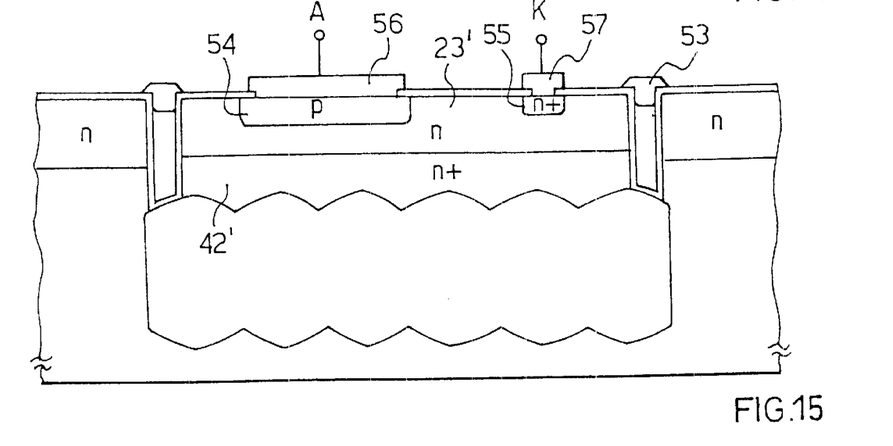

Two planar regions, a p-type region indicated 54 and a n-type region 55 with low resistivity are formed by usual photolithography, etching and doping techniques. Finally, two metal electrodes 56 and 57 with the functions of the anode electrode A and of the cathode electrode K of the diode, respectively, are formed on the surfaces of the regions 54 and 55, respectively.

Although only one example of the method according to the invention has been described and illustrated, many variations and modifications are possible. For example, the buried layer may be formed on the entire wafer or on an area more extensive than that of the oxide plaque if the integrated circuit requires other components with low resistance during conduction. Hence the invention is to be limited only by the scope of the claims that follow and the equivalents thereof.

What is claimed is:

1. A method of forming a structure with a buried region in a semiconductor device comprising the following steps:

a. providing a monocrystalline silicon substrate with a flat major surface, b. introducing doping impurities into the substrate through a portion of the major surface of the substrate to a first depth to form a planar region with a first type of conductivity, c. subjecting the substrate to selective anisotropic etching to hollow out trenches in the substrate from the said portion of the major surface to a second depth greater than the first depth, d. oxidizing the silicon within the trenches starting a selected distance from the major surface of the substrate, until the portions of the substrate between adjacent trenches are transformed into silicon dioxide and until the trenches are filled with silicon dioxide below the level defined by the selected distance to form a silicon dioxide plaque, e. subjecting the substrate to a treatment of epitaxial growth from a vapor phase, the operative parameters selected to permit a growth of monocrystalline silicon both inside the portions of the trenches that are still open until the trenches are closed and on top of the major surface of the substrate, and to permit a redistribution of the doping impurities into the monocrystalline silicon grown to form a region with the first type of conductivity with substantially homogeneous resistivity buried in an epitaxial layer and extending on the silicon dioxide plaque.

2. The method of claim 1, in which the step of subjecting the substrate to a treatment of epitaxial growth comprises the introduction of doping impurities with the first type of conductivity during the monocrystalline silicon growth.

3. The method of claim 2, comprising the formation of an insulating frame that extends from a free surface of the epitaxial layer to as far as the silicon dioxide plaque, and within which is defined a portion of monocrystalline silicon formed substantially by the buried region and by an epitaxial region with resistivity greater than that of the buried region.

4. The method of claim 3, in which the formation of an insulating frame comprises the hollowing-out of a channel at least through the epitaxial layer, the covering of the walls of the channel with insulating material, and the filling of the channel with polycrystalline silicon.

5. The method of claim 3, in which the formation of an insulating frame comprises the formation of a region with a second type of conductivity for a junction insulation.

6. The method of claim 5, comprising the formation of a planar region with the second type of conductivity in the epitaxial region, and of a planar region with the first type of conductivity and with resistivity lower than that of the epitaxial region, and the formation of contact electrodes on the surfaces of these planar regions.

7. A method for forming a semiconductor device on a monocrystalline silicon substrate, comprising:

introducing doping impurities to form a planar region of a first depth to have a first conductivity type in the monocrystalline silicon substrate;

etching the planar region and the monocrystalline silicon substrate to form trenches through the planar region and into the monocrystalline silicon substrate;

transforming regions in the monocrystalline silicon substrate below the planar region and between the trenches into silicon dioxide to form a silicon dioxide plaque; and forming a buried region of the first conductivity type over the silicon dioxide plaque by subjecting the monocrystalline silicon substrate to epitaxial growth to fill in the trenches and redistribute doping impurities to achieve homogenous resistivity throughout the buried region.

8. The method of claim 7, wherein forming the planar region further comprises introducing doping impurities into the planar region through the monocrystalline silicon substrate to the first depth.

9. The method of claim 8, wherein forming the buried region by subjecting the substrate to epitaxial growth comprises growing the monocrystalline silicon substrate material between the trenches in a lateral direction to fill the trenches and in a vertical direction.

10. The method of claim 9, wherein the epitaxial growth is performed from a vapor phase in an atmosphere containing doping impurities.

11. The method of claim 10, wherein forming the buried region comprises growing the monocrystalline silicon substrate to form a residual epitaxial layer over the buried region having the same type of conductivity as the buried region and a greater resistivity.

12. The method of claim 11, wherein the epitaxial growth takes place at a temperature in the range of 900 to 1230° Centigrade for a duration of about 15 minutes.

13. The method of claim 11, further comprising:
   forming channels from the surface of the residual epitaxial layer to the silicon dioxide plaque, the channel formed to enclose within it a portion of the epitaxial layer and the underlying buried layer;
   covering the surface of the residual epitaxial layer and the internal walls of the channels with a layer of dielectric material; and
   forming a silicon dioxide insert in mouths of the channels to close the channels.

14. The method of claim 13, wherein forming the silicon dioxide insert comprises depositing polysilicon to fill the channels and to cover the dielectric material over the epitaxial layer; partially removing the polysilicon layer and oxidizing the remaining portion to form the silicon dioxide insert in the mouths of the channels.

15. A method of forming structures with varied regions in a semiconductor device, the method comprising:
   implanting doping impurities of a high concentration in a monocrystalline silicon substrate to form a planar region of a first conductivity type;
   forming trenches to a depth greater than a depth of the planar region;
   oxidizing the silicon inside the trenches a selected distance from the surface of the monocrystalline silicon substrate until a silicon dioxide plaque is formed that is surmounted by residual areas of the doped planar region; and
   subjecting the residual areas to epitaxial growth to close the trenches and redistribute doping impurities into the silicon grown during the epitaxial growth to produce a buried region with low resistivity beneath an epitaxial layer of high resistivity.

16. The method of claim 15, wherein the trenches are formed by selective anisotropic etching.

17. The method of claim 15, wherein forming the trenches comprises:
   forming a protective mask over the monocrystalline silicon substrate and planar region; and
   hollowing out the trenches with selective anisotropic etching through the planar region and into the monocrystalline silicon substrate.

18. The method of claim 15, wherein subjecting the monocrystalline silicon substrate to epitaxial growth comprises initially removing at least portions of the mask to expose the residuals of the planar region having a high doping concentration.

19. The method of claim 15, wherein the epitaxial growth takes place at a temperature in the range of 900 to 1230° Centigrade.

20. The method of claim 18, wherein the epitaxial growth takes place for a duration of about 15 minutes.

21. The method of claim 18, wherein the epitaxial growth takes place in an atmosphere containing doping impurities.

22. A method of forming a structure with a buried region in a semiconductor device comprising the following steps:
   a. providing a monocrystalline silicon substrate with a flat major surface,
   b. introducing doping impurities into the substrate through a portion of the major surface of the substrate to a first depth to form a planar region with a first type of conductivity,
   c. subjecting the substrate to selective anisotropic etching to hollow out trenches in the substrate from the said portion of the major surface to a second depth greater than the first depth,
   d. oxidizing the silicon within the trenches starting a selected distance from the major surface of the substrate, until the portions of the substrate between adjacent trenches are transformed into silicon dioxide and until the trenches are filled with silicon dioxide below the level defined by the selected distance to form a silicon dioxide plaque,
   e. subjecting the substrate to a treatment of epitaxial growth from a vapor phase, and introducing doping impurities with the first type of conductivity during the monocrystalline silicon growth, the operative parameters selected to permit a growth of monocrystalline silicon both inside the portions of the trenches that are still open until the trenches are closed and on top of the major surface of the substrate, and to permit a redistribution of the doping impurities into the monocrystalline silicon grown to form a region with the first type of conductivity with substantially homogeneous resistivity buried in an epitaxial layer and extending on the silicon dioxide plaque, and
   forming an insulating frame that extends from a free surface of the epitaxial layer to as far as the silicon dioxide plaque, and within which is defined a portion of monocrystalline silicon formed substantially by the buried region and by an epitaxial region with resistivity greater than that of the buried region, and the formation of a region with a second type of conductivity for a junction insulation.

23. A method of forming a structure with a buried region in a semiconductor device comprising the following steps:
   a. providing a monocrystalline silicon substrate with a flat major surface,
   b. introducing doping impurities into the substrate through a portion of the major surface of the substrate to a first depth to form a planar region with a first type of conductivity,
   c. subjecting the substrate to selective anisotropic etching to hollow out trenches in the substrate from the said portion of the major surface to a second depth greater than the first depth,
   d. oxidizing the silicon within the trenches starting a selected distance from the major surface of the substrate, until the portions of the substrate between adjacent trenches are transformed into silicon dioxide and until the trenches are filled with silicon dioxide below the level defined by the selected distance to form a silicon dioxide plaque, e. subjecting the substrate to a treatment of epitaxial growth from a vapor phase, and introducing doping impurities with the first type of conductivity during the monocrystalline silicon growth, the operative parameters selected to permit a growth of monocrystalline silicon both inside the portions of the trenches that are still open until the trenches are closed and on top of the major surface of the substrate, and to permit a redistribution of the doping impurities into the monocrystalline silicon grown to form a region with the first type of conductivity with substantially homogeneous resistivity buried in an epitaxial layer and extending on the silicon dioxide plaque, forming an insulating frame that extends from a free surface of the epitaxial layer to as far as the silicon dioxide plaque, and within which is defined a portion of monocrystalline silicon formed substantially by the buried region and by an epitaxial region with resistivity greater than that of the buried region, and the formation of a region with a second type of conductivity for a junction insulation, and forming a planar region with the second type of conductivity in the epitaxial region, and forming a planar region with the first type of conductivity and with resistivity lower than that of the epitaxial region, and forming contact electrodes on the surfaces of the planar regions of first and second type of conductivity.

24. A method for forming a semiconductor device on a monocrystalline silicon substrate, comprising:

forming a planar region of a first depth to have a first conductivity type in the monocrystalline silicon substrate and introducing doping impurities into the planar region to the predetermined depth;

etching the planar region and the monocrystalline silicon substrate to form trenches through the planar region and into the monocrystalline silicon substrate;

transforming regions in the monocrystalline silicon substrate below the planar region and between the trenches into silicon dioxide to form silicon dioxide plaque;

forming a buried region of the first conductivity type over the silicon dioxide plaque by subjecting the monocrystalline silicon substrate to epitaxial growth by growing the monocrystalline silicon substrate material between the trenches in a lateral direction to fill the trenches and in a vertical direction to form a residual epitaxial layer over the buried region having the same type of conductivity as the buried region and a greater resistivity and to redistribute doping impurities to achieve homogenous resistivity throughout the buried region;

forming channels from the surface of the residual epitaxial layer to the silicon dioxide plaque, the channel formed to enclosed within it a portion of the epitaxial layer and the underlying buried layer;

covering the surface of the residual epitaxial layer and the internal walls of the channels with a layer of dielectric material; and forming a silicon dioxide insert in mouths of the channels to close the channels.

25. A method for forming a semiconductor device on a monocrystalline silicon substrate, comprising:

forming a planar region of a first depth to have a first conductivity type in the monocrystalline silicon substrate and introducing doping impurities into the planar region to the predetermined depth;

etching the planar region and the monocrystalline silicon substrate to form trenches through the planar region and into the monocrystalline silicon substrate;

transforming regions in the monocrystalline silicon substrate below the planar region and between the trenches into silicon dioxide to form silicon dioxide plaque;

forming a buried region of the first conductivity type over the silicon dioxide plaque by subjecting the monocrystalline silicon substrate to epitaxial growth by growing the monocrystalline silicon substrate material between the trenches in a lateral direction to fill the trenches and in a vertical direction to form a residual epitaxial layer over the buried region having the same type of conductivity as the buried region and a greater resistivity and to redistribute doping impurities to achieve homogenous resistivity throughout the buried region;

forming channels from the surface of the residual epitaxial layer to the silicon dioxide plaque, the channel formed to enclosed within it a portion of the epitaxial layer and the underlying buried layer;

covering the surface of the residual epitaxial layer and the internal walls of the channels with a layer of dielectric material; and forming a silicon dioxide insert in mouths of the channels to close the channels by depositing polysilicon to fill the channels and to cover the dielectric material over the epitaxial layer, partially removing the polysilicon layer and oxidizing the remaining portion to form the silicon dioxide insert in the mouths of the channels.

* * * * *